(12) United States Patent
Kong et al.

(10) Patent No.: US 12,512,414 B2
(45) Date of Patent: Dec. 30, 2025

(54) VERTICAL INTERCONNECT DESIGN FOR IMPROVED ELECTRICAL PERFORMANCE

(71) Applicant: Intel Corporation, Santa Clara, CA (US)

(72) Inventors: Jackson Chung Peng Kong, Pulau Pinang (MY); Bok Eng Cheah, Pulau Pinang (MY); Kok Hou Teh, Bayan Lepas (MY); Kooi Chi Ooi, Pulau Pinang (MY); Li Wern Chew, Penang (MY)

(73) Assignee: Intel Corporation, Santa Clara, CA (US)

( * ) Notice: Subject to any disclaimer, the term of this patent is extended or adjusted under 35 U.S.C. 154(b) by 933 days.

(21) Appl. No.: 17/498,001

(22) Filed: Oct. 11, 2021

(65) Prior Publication Data

US 2023/0113084 A1   Apr. 13, 2023

(51) Int. Cl.
*H01L 23/538* (2006.01)
*H01L 23/00* (2006.01)
*H01L 23/498* (2006.01)

(52) U.S. Cl.
CPC .... *H01L 23/5386* (2013.01); *H01L 23/49816* (2013.01); *H01L 23/5383* (2013.01); *H01L 23/5384* (2013.01); *H01L 23/5385* (2013.01); *H01L 24/16* (2013.01); *H01L 2924/15311* (2013.01)

(58) Field of Classification Search
None
See application file for complete search history.

(56) References Cited

U.S. PATENT DOCUMENTS

| 2016/0095217 | A1* | 3/2016 | Kurauchi | H05K 3/242 |
| | | | | 174/261 |
| 2016/0165721 | A1* | 6/2016 | Kwon | H05K 3/1208 |
| | | | | 174/254 |
| 2017/0020000 | A1* | 1/2017 | Yamakami | H01L 23/5389 |
| 2019/0281705 | A1* | 9/2019 | Hanya | H05K 3/4061 |
| 2021/0045233 | A1* | 2/2021 | Mayr | H05K 3/4076 |
| 2022/0151069 | A1* | 5/2022 | Koyama | H05K 3/386 |
| 2023/0049806 | A1* | 2/2023 | Joung | H05K 1/112 |

FOREIGN PATENT DOCUMENTS

EP    2584598 A1 *  4/2013  ....... H01L 21/76898

* cited by examiner

*Primary Examiner* — Krystal Robinson
(74) *Attorney, Agent, or Firm* — Viering, Jentschura & Partner mbB

(57) ABSTRACT

The present disclosure generally relates to a printed circuit board assembly that may include a circuit board having a first surface and an opposing second surface. The printed circuit board assembly may also include a first interconnect barrel disposed in the circuit board. The first interconnect barrel may have a first length extending between the first surface and the second surface. The first interconnect barrel may include a first section, and may further include a second section spaced apart from the first section by a first gap having a first depth extending partially through the first length. The printed circuit board assembly may further include a first conductive trace coupled to the first section and a second conductive trace coupled to the second section at a first terminal.

12 Claims, 13 Drawing Sheets

VERTICAL INTERCONNECT DESIGN FOR IMPROVED ELECTRICAL PERFORMANCE

BACKGROUND

In a Type-3 printed circuit board (PCB) and its associated plated through hole (PTH) structure, signal propagating from a system-on-chip (SOC) to a memory device, or vice versa, transitions via inner PCB layers albeit with PTH stub. The unused stub is a conductive portion of the PTH not connected in series with the circuit. It presents itself as an un-terminated transmission line with significant signal degradation around its resonant frequency (determined by the quarter wavelength of the structure). The longer the stub, the larger the impedance discontinuity is, and hence, leading to a significant signal attenuation loss. These stubs could reduce system memory performance, for example, LPDDRS data rate of 8500 MT/s to a couple of speed bins down to 7200 MT/s. For high-speed differential I/O such as 40 Gbps TBT4, the platform channel length may need to be reduced from 8" to 6" to compensate the electrical impairments caused by PTH stubs. In a typical Type-3 PCB design, the signaling path could have 2 or more PTH stubs in the end-to-end channel from SOC to memory device.

A current solution to address this issue is to design a more expensive Type-4 High Density Interconnect (HDI) PCB, replacing PTH with a stack of micro-vias. This allows signal traces to be routed at inner layer without the electrical stub concern. However, this means a higher bill of materials (BOM) cost for major manufacturers.

Another current solution is simply to cope with the Type-3 PTH stub impairment, albeit with degraded system memory performance, such as from the maximum possible LPDDRS data rate of 8500 MT/s to a couple of speed bins down to 7200 MT/s. However, sticking to lower cost Type-3 PCBs would mean inferior system memory performance and thus, mediocre user experience.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects may be combined with one or more other aspects to form new aspects.

The present disclosure addresses the signal integrity degradation issue caused by plated through hole (PTH) stub in a conventional Type-3 printed circuit board (PCB) design. Briefly, an electronic assembly with serpentine vertical interconnects for improved electrical performance and device miniaturization may be provided. By removing open-ended PTH stub designs in the electronic assembly, problems associated with such design may be avoided or alleviated.

Figure 2A:
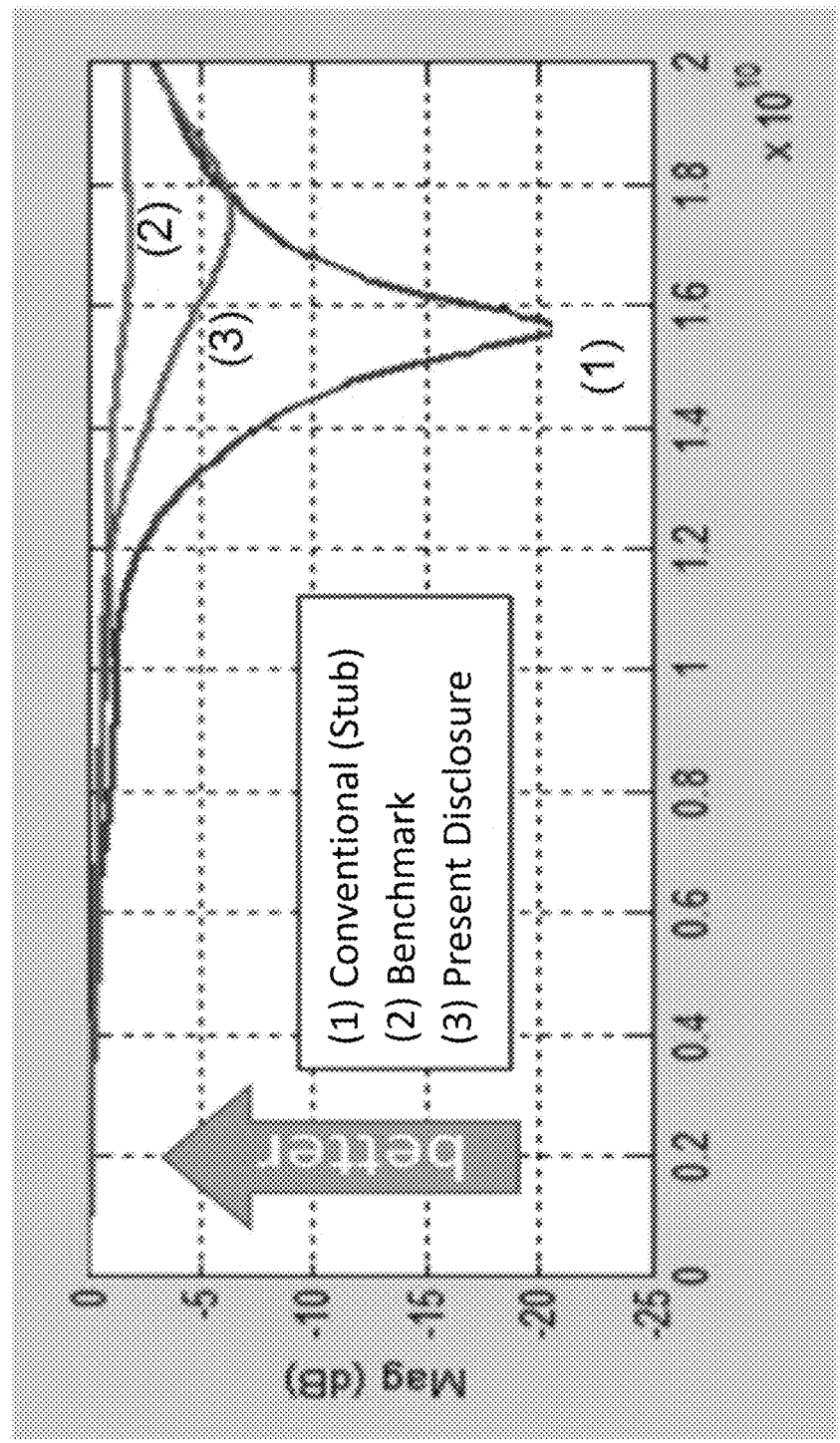
FIGS. 2A and 2B show insertion loss and impedance deviation comparison study of a printed circuit board assembly according to an aspect of the present disclosure.
Figure 2B:
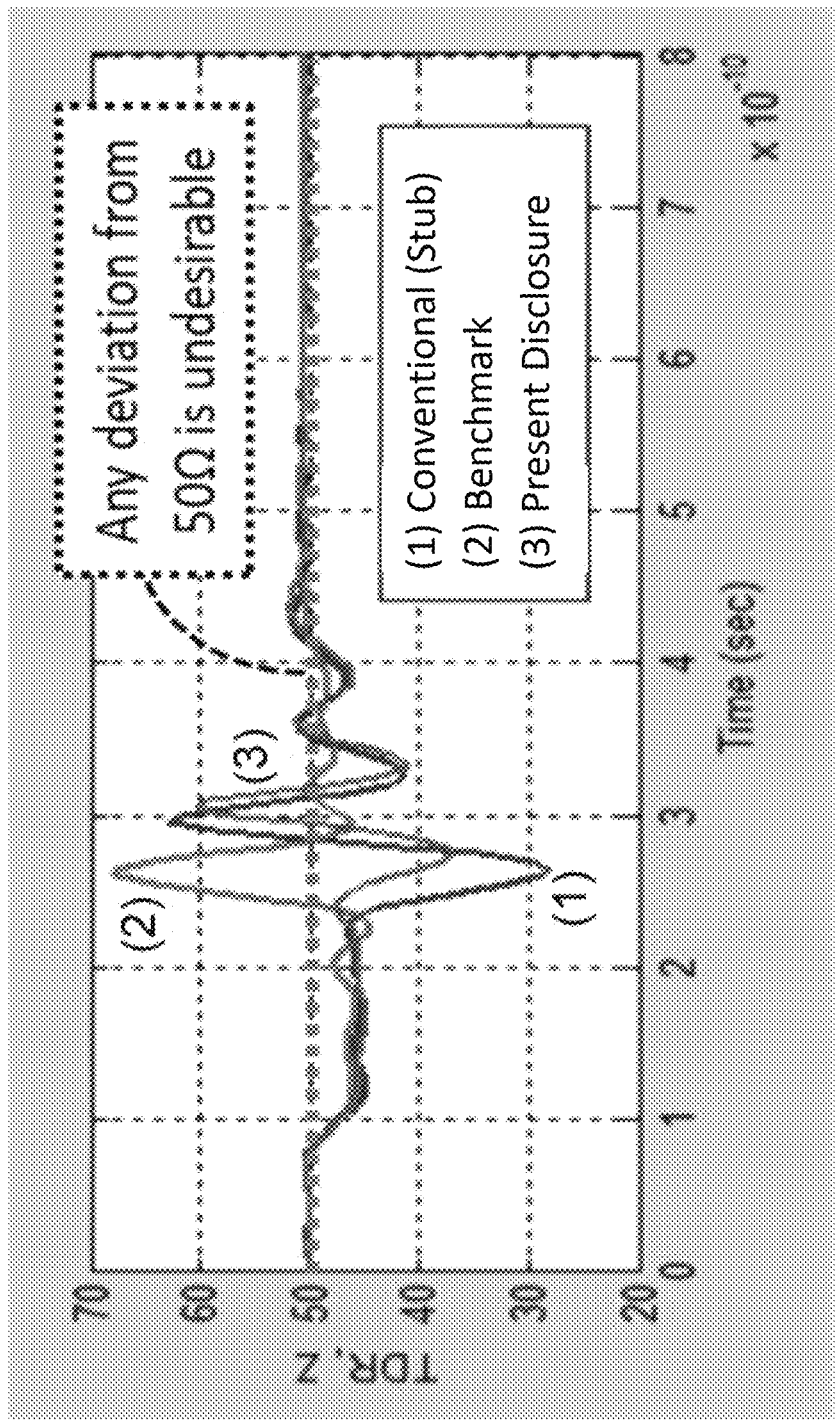
Figure 3A:
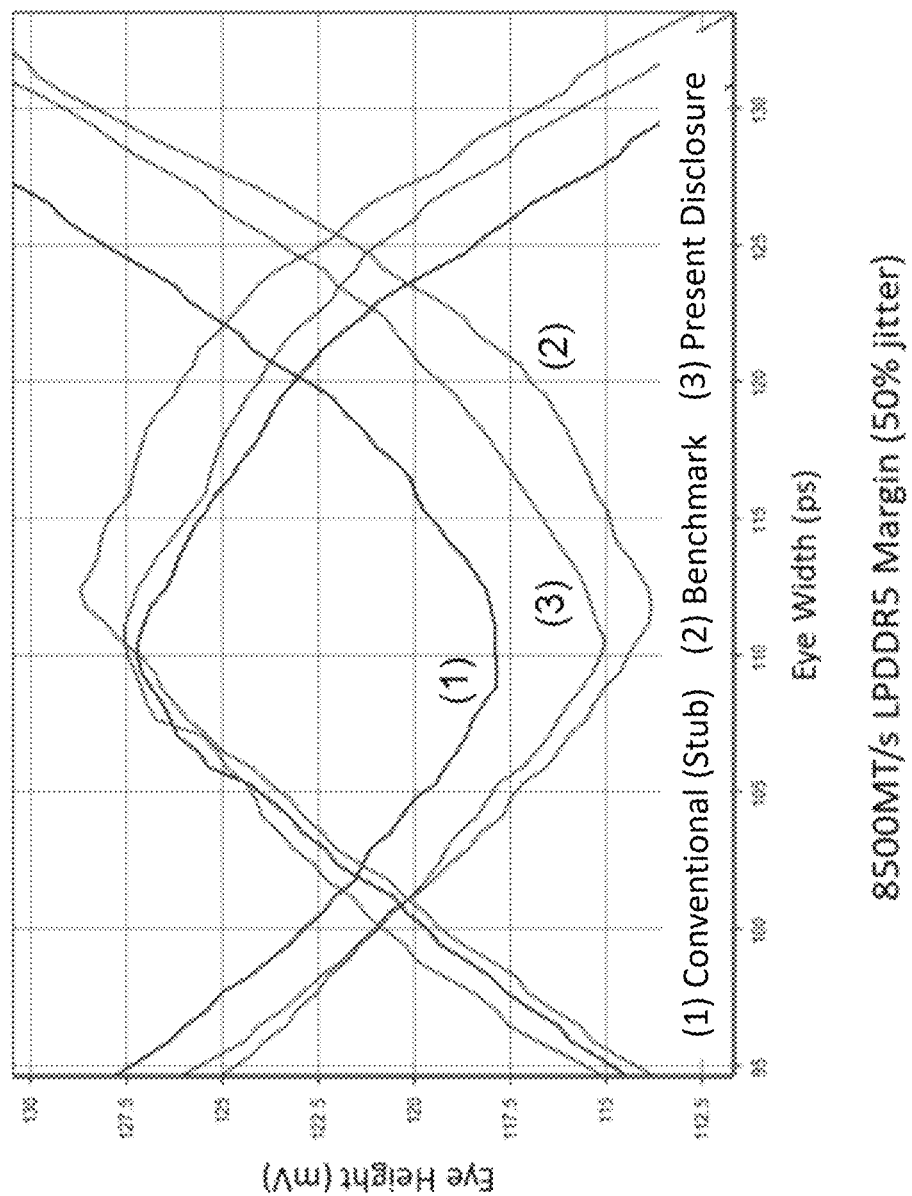
FIGS. 3A and 3B show simulated channel margins of 8500MT/s LPDDRS and 10 Gbps USB of a printed circuit board assembly according to an aspect of the present disclosure.
Figure 3B:
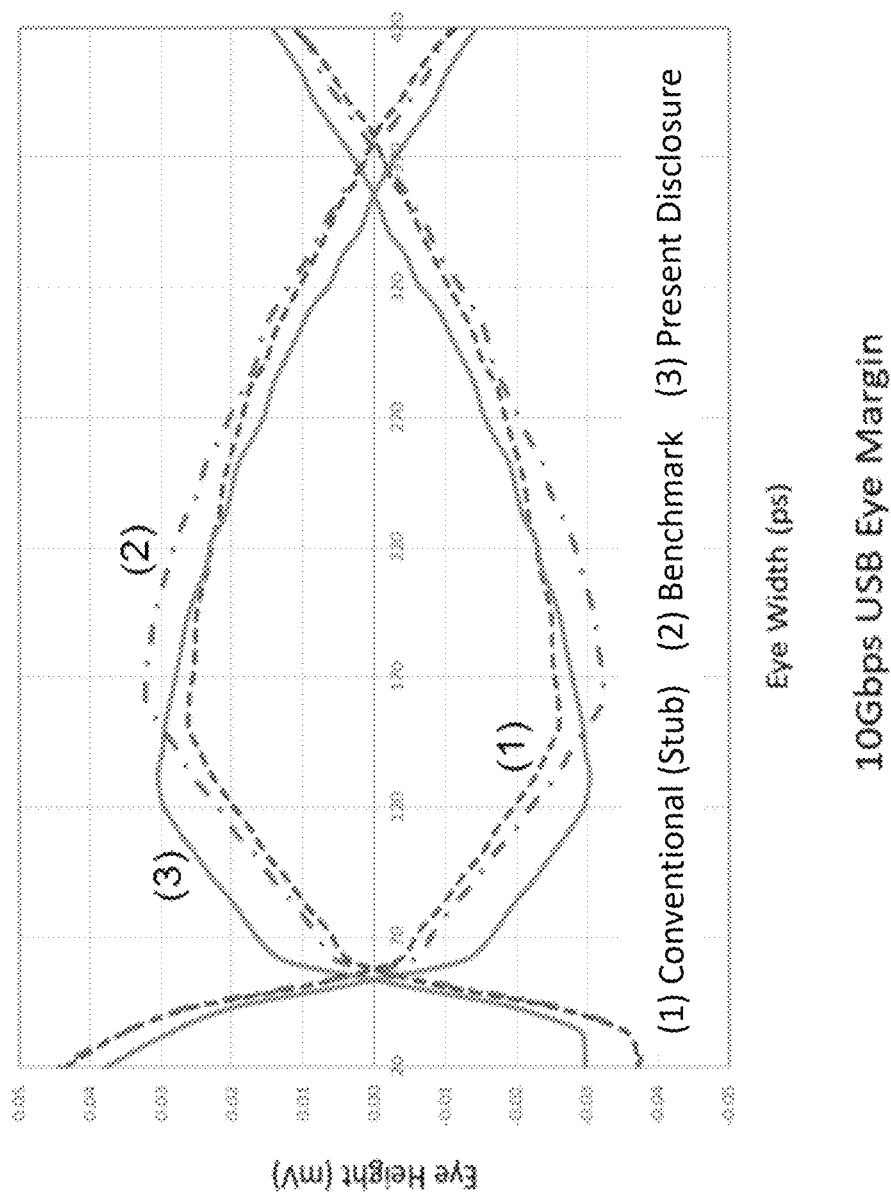

The technical advantages of this disclosure may include but are not limited to:

Improved signal integrity performance. This can be achieved primarily with the reduction or removal of open-ended PTH stub, therefore minimizing reflection noises. The simulated electrical data is presented in FIGS. 2A, 2B, 3A and 3B. It can be observed from FIG. 2A that the insertion loss is significantly reduced, from worst-case −20 dB to −7 dB around 15-20 GHz range. On time-domain TDR (FIG. 2B), the present impedance deviation is also less with reduced peak and valley impedances. The improvement of these key electrical impairments translates to better channel performance, as illustrated in FIGS. 3A and 3B. 15-20% of eye margin improvement can be seen in simulated 8500MT/s LPDDRS and 10 Gbps USB channel. In the USB case, eye opening of the invention is as good as the best case stub-less PTH structure.

Platform miniaturization can be achieved without the need for high-speed signal traces to compete for bottom PCB layers routing, which is the case in existing designs. Without PTH stub concern, signals could also be routed in the top PCB layers thus easing the routing congestion. This facilitates PCB layer count reduction, and ultimately leads to platform miniaturization.

Platform Z-height reduction through avoidance of higher count PCB layout design. Most existing signal traces are routed in the bottom half of PCB. By implementing various aspects of the present disclosure, signals traces can be brought to top half of PCB, which ultimately reduces the number of PCB layers needed.

The present disclosure generally relates to a printed circuit board assembly that may include a circuit board having a first surface and an opposing second surface. The printed circuit board assembly may also include a first interconnect barrel disposed in the circuit board. The first interconnect barrel may have a first length extending between the first surface and the second surface. The first interconnect barrel may include a first section, and may further include a second section spaced apart from the first section by a first gap having a first depth extending partially through the first length. The printed circuit board assembly may further include a first conductive trace coupled to the first section and a second conductive trace coupled to the second section at a first terminal.

In various aspects, the first interconnect barrel may be configured to include a cylinder with a closed bottom and an open top. The cylinder may include a slit that may partially cut through the cylinder from the open top towards the closed bottom to form the first section (or first side wall) and the second section (or second side wall). The first and the second sections may be connected by the closed bottom. In other words, when viewed from a cross-sectional perspective, the first and the second sections separated by the first gap may form a "U" shape or a serpentine vertical interconnect. It is to be understood and appreciated that other barrel configurations may also be suitable, so long as a serpentine interconnect may be formed, for example, a cuboid with a closed bottom and an open top.

In various aspects, the printed circuit board assembly may further include a second interconnect barrel disposed in the circuit board, the second interconnect barrel having a second length extending between the first surface and the second surface.

In further aspects, the second interconnect barrel may include a subsequent first section, and may further include a subsequent second section spaced apart from the subsequent first section by a second gap having a second depth extending partially through the second length.

In various aspects, the second interconnect barrel may be configured to include a cylinder with a closed bottom and an open top. The cylinder may include a slit that may partially cut through the cylinder from the open top towards the closed bottom to form the subsequent first section (or subsequent first side wall) and the subsequent second section (or subsequent second side wall). The subsequent first and the subsequent second sections may be connected by the closed bottom. In other words, when viewed from a cross-sectional perspective, the subsequent first and the subsequent second sections separated by the second gap may form a "U" shape or a serpentine vertical interconnect. It is to be understood and appreciated that other barrel configurations may also be suitable, so long as a serpentine interconnect may be formed, for example, a cuboid with a closed bottom and an open top.

In various aspects, the second conductive trace may be coupled to the subsequent second section at a second terminal.

In various aspects, the first depth or the second depth may range between 15% and 95% of the first length or the second length, respectively.

In various aspects, the first gap, the second gap, or both, may include a dielectric layer or air.

In various aspects, the first and second conductive traces may extend in parallel to the first surface and the second surface.

In various aspects, the first conductive trace may be disposed adjacent the first surface.

In various aspects, the printed circuit board assembly may further include a first voltage reference plane disposed between the first conductive trace and a first side of the second conductive trace.

In various aspects, the printed circuit board assembly may further include a second voltage reference plane disposed adjacent the second conductive trace on a second side opposite the first side.

In various aspects, the printed circuit board assembly may further include a first device coupled to the first interconnect barrel through the first conductive trace and the first section.

In various aspects, the printed circuit board assembly may further include a second device coupled to the second interconnect barrel through a subsequent first conductive trace and the subsequent first section, wherein the subsequent first conductive trace may be spaced apart from the second conductive trace by the first voltage reference plane.

The present disclosure also generally relates to a computing device. The computing device may include a communication chip and a printed circuit board assembly coupled to the communication chip. The printed circuit board assembly may include a circuit board having a first surface and an opposing second surface. The printed circuit board assembly may also include a first interconnect barrel disposed in the circuit board. The first interconnect barrel may have a first length extending between the first surface and the second surface. The first interconnect barrel may include a first section, and may further include a second section spaced apart from the first section by a first gap having a first depth extending partially through the first length. The printed circuit board assembly may further include a first conductive trace coupled to the first section and a second conductive trace coupled to the second section at a first terminal.

The present disclosure further generally relates to a method. The method may include providing a circuit board having a first surface and an opposing second surface. The method may further include disposing a first interconnect barrel in the circuit board, the first interconnect barrel having a first length extending between the first surface and the second surface, the first interconnect barrel including a first section, and further including a second section spaced apart from the first section by a first gap having a first depth extending partially through the first length. The method may also include coupling a first conductive trace to the first section and may further include coupling a second conductive trace to the second section at a first terminal.

To more readily understand and put into practical effect the present disclosure, particular aspects will now be described by way of examples and not limitations, and with reference to the drawings. For the sake of brevity, duplicate descriptions of features and properties may be omitted.

Figure 1A:
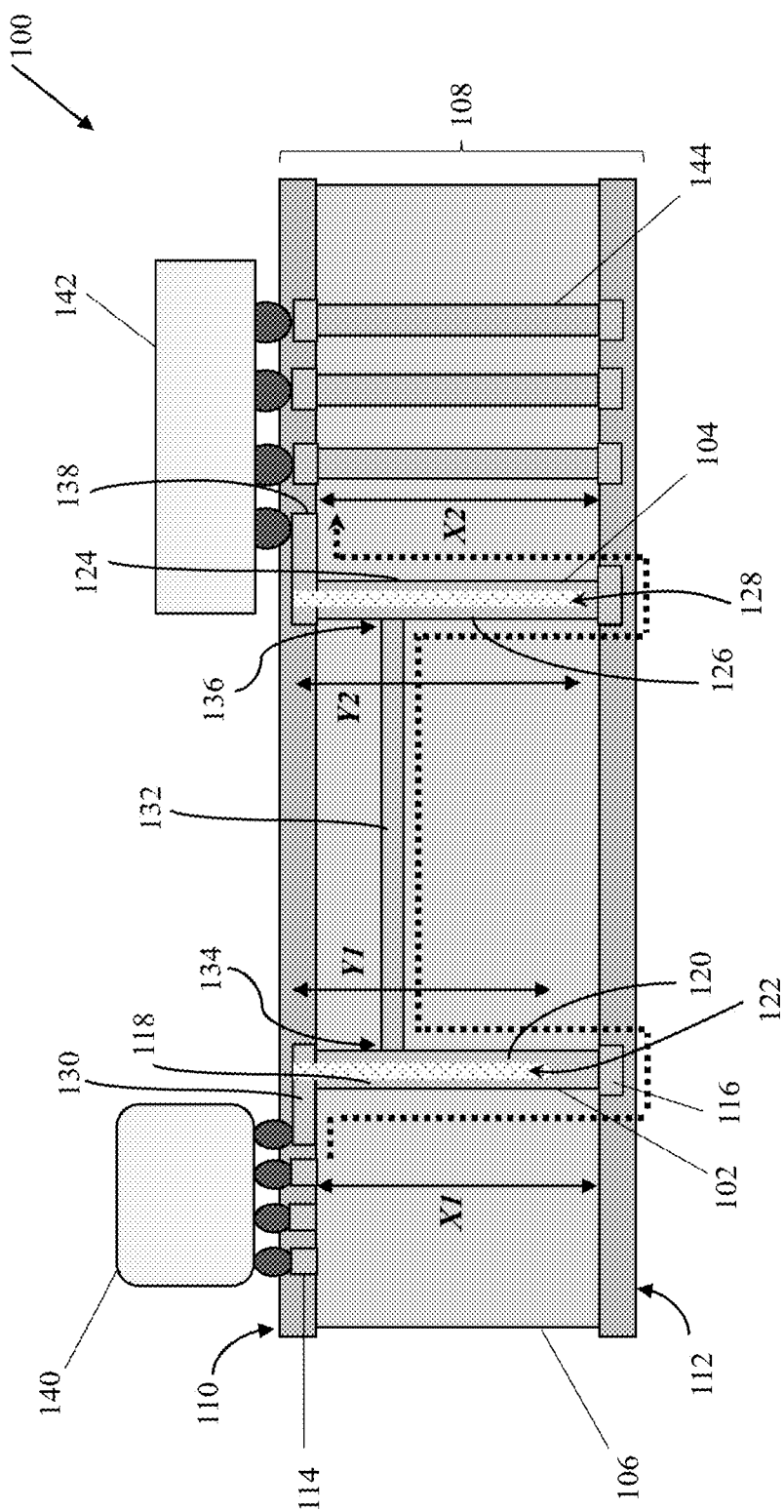
FIG. 1A shows a cross-sectional view of a printed circuit board assembly according to an aspect of the present disclosure.
Figure 1B:
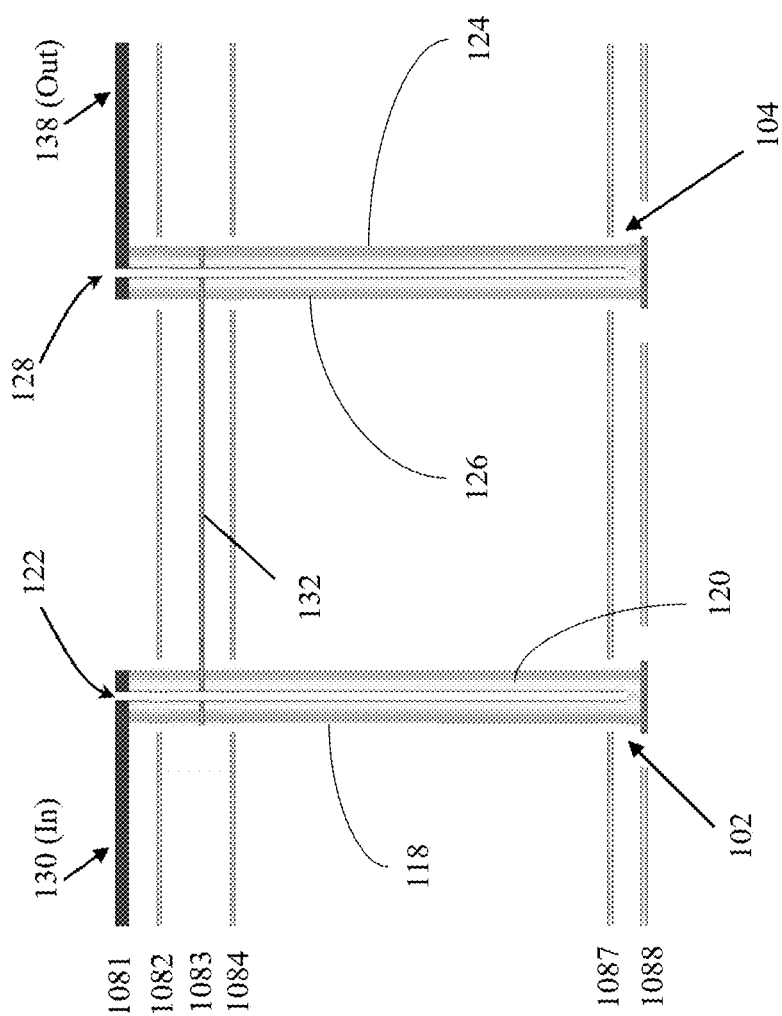
FIG. 1B shows an illustration of a single ended routing configuration in the printed circuit board assembly of FIG. 1A.
Figure 1C:
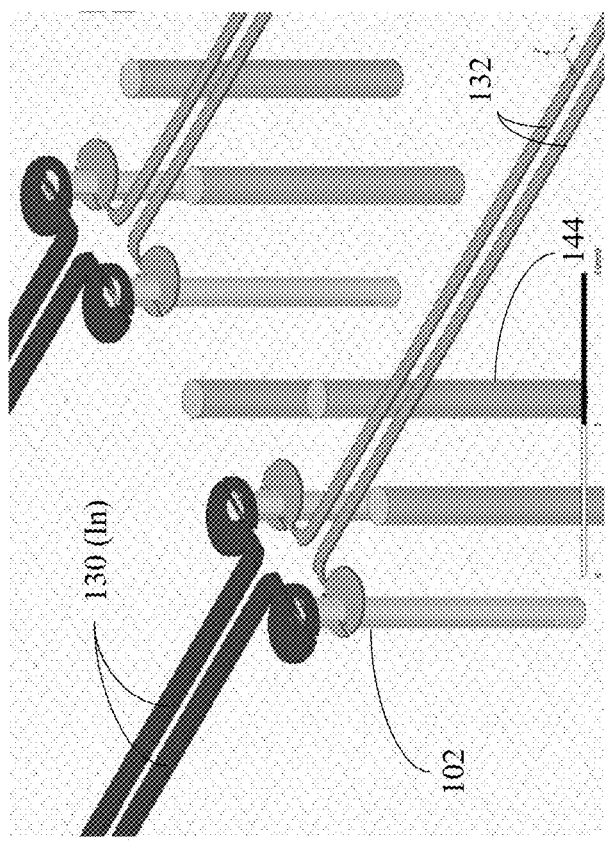
FIG. 1C shows different routing configurations for an electrical signal transmission using the serpentine vertical interconnects of FIG. 1A.
Figure 1C:
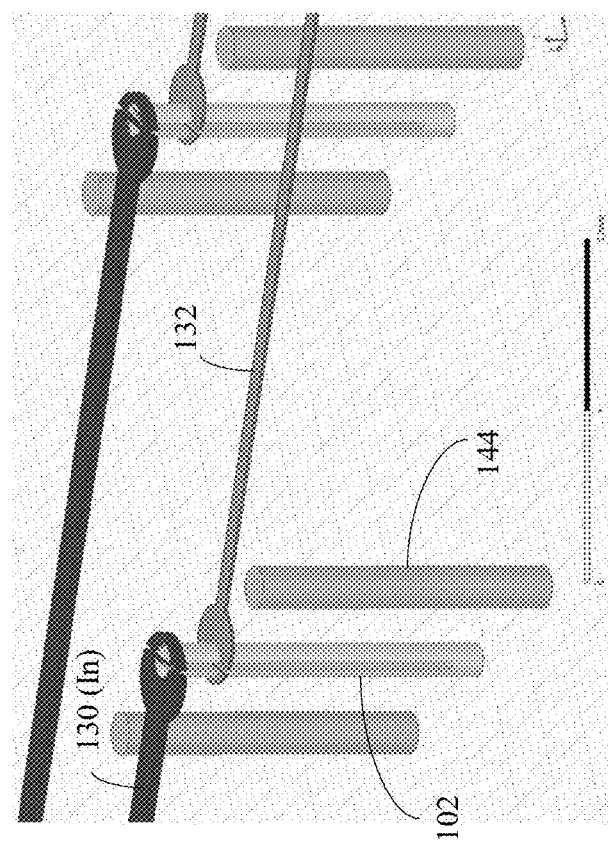

FIG. 1A shows a cross-sectional view of a printed circuit board assembly (also termed as an electronic assembly) 100 with serpentine vertical interconnects 102, 104 according to an aspect of the present disclosure. In this illustration, it is shown the printed circuit board assembly 100, e.g., a multichip module assembly, for improved electrical performance and device miniaturization. FIG. 1B shows an illustration of a single ended routing configuration in the printed circuit board assembly 100 of FIG. 1A. FIG. 1C shows different routing configurations for an electrical signal transmission using the serpentine vertical interconnects 102, 104 of FIG. 1A.

The term "multichip module" generally refers to a printed circuit board assembly that may include two or more silicon chips or devices that may be arranged laterally along the same plane. As different types of devices cater to different types of applications, more silicon chips or devices may be required in some systems to meet the requirements of high performance applications.

In FIG. 1A, the printed circuit board assembly 100 may include a printed circuit board 106. The circuit board 106 may include a build-up of metal layers 108, i.e., a multi-layer printed circuit board. For example, the circuit board 106 may be a Type-3 printed circuit board including a build-up of up to eight metal layers.

The circuit board 106 may have a first surface 110 and an opposing second surface 112. In the aspect shown in FIG. 1A, the first surface 110 may be a top surface and the second surface 112 may be a bottom surface. The circuit board 106 may include a plurality of first surface contact pads 114 on the first surface 110, and may further include a plurality of second surface contact pads 116 on the second surface 112.

The printed circuit board assembly 100 may have solder balls, electrical interconnects and routings, and other features, which may or may not be shown in any of the present figures and which are conventional features known to a person skilled in the art. Various couplings of the components may use conventional methods, including solder reflow, thermal compression bonding, or other metal diffusion method.

In various aspects, the printed circuit board assembly 100 may include a first interconnect barrel 102 disposed in the circuit board 106. In the aspect shown in FIG. 1A, the first interconnect barrel 102 may have a first length X1 extending between the first and the second surfaces 110, 112. The first interconnect barrel 102 may include a first section 118, and may further include a second section 120 spaced apart from the first section 118 by a first gap 122 having a first depth Y1 extending partially through the first length X1. The first length X1 may range between 0.4 mm and 2.5 mm. The first depth Y1 may range between 15% and 95% of the first length X1.

In various aspects, the printed circuit board assembly 100 may further include a second interconnect barrel 104 disposed in the circuit board 106. In the aspect shown in FIG. 1A, the second interconnect barrel 104 may have a second length X2 extending between the first and the second surfaces 110, 112. The second length X2 may extend in parallel to the first length X1. The second interconnect barrel 104 may include a subsequent first section 124, and may further include a subsequent second section 126 spaced apart from the subsequent first section 124 by a second gap 128 having a second depth Y2 extending partially through the second length X2. The second length X2 may range between 0.4 mm and 2.5 mm. The second depth Y2 may range between 15% and 95% of the second length X2. The first length X1 and the second length X2 may be the same or different. The first depth Y1 and the second depth Y2 may be the same or different. In an aspect, the second depth Y2 may be configured to be different to the first depth Y1 for an optimized transmission line impedance profile.

In various aspects, the first gap 122, the second gap 128, or both, may be filled with a dielectric layer or air. For example, the dielectric layer may be a layer of an epoxy polymer resin, a polyimide, a polyester, a solder mask and/or a silicone. In an aspect, the first gap 122 may include a first width ranging between 50 μm and 200 μm. In another aspect, the second gap 128 may include a second width ranging between 50 μm and 200 μm. The first and the second widths may be the same or different.

The printed circuit board assembly 100 may further include a first conductive trace 130 coupled to the first section 118 and a second conductive trace 132 coupled to the second section 120 at a first terminal 134. The first conductive trace 130 may be disposed adjacent the first surface 110 and thus, may be coupled to the first section 118 of the first interconnect barrel 102 adjacent the first surface 110. The second conductive trace 132 may be disposed between the first and the second surfaces 110, 112, for example, on one metal layer embedded in the circuit board 106. The first and the second conductive traces 130, 132 may extend in parallel to the first and second surfaces 110, 112. The first interconnect barrel 102 may be further coupled to one of the second surface contact pads 116.

The second conductive trace 132 may be further coupled to the subsequent second section 126 at a second terminal 136. A subsequent first conductive trace 138 may be disposed adjacent the first surface 110 and may further be coupled to the subsequent first section 124. The second interconnect barrel 104 may be coupled to one of the second surface contact pads 116. A serpentine signal path (shown as dotted line in FIG. 1A) may thus be formed which may travel from the first conductive trace 130, first section 118, second section 120, second conductive trace 132, subsequent second section 126, subsequent first section 124 to the subsequent first conductive trace 138.

As mentioned above, the circuit board 106 may include a build-up of eight metal layers 1081-1088. For example, the metal layer adjacent the first surface 110 may be termed as a first metal layer 1081 and the metal layer adjacent the second surface 112 may be termed as an eighth metal layer 1088. In the aspect shown in FIG. 1B, the first conductive trace 130 and the subsequent first conductive trace 138 may be adjacent the first metal layer 1081. The second conductive trace 132 may be adjacent a third metal layer 1083. The printed circuit board assembly 100 may include a first voltage reference plane disposed between the first conductive trace 130 and a first side of the second conductive trace 132. The printed circuit board assembly 100 may further include a second voltage reference plane disposed adjacent the second conductive trace 132 on a second side opposite the first side. In one aspect, the first voltage reference plane may be formed on the second metal layer 1082 and the second voltage reference plane may be formed on the fourth metal layer 1084. In an aspect, the first and second voltage reference planes may be associated with a reference voltage, e.g., a ground (Vss) reference voltage or a power supply (Vcc) reference voltage, to facilitate a current return path for signal transmission through the first conductive, the second conductive and the subsequent first conductive traces 130, 132, 138.

In the aspect shown in FIG. 1A, the printed circuit board assembly 100 may include a first device 140, e.g., a memory device or a connector receptacle, coupled to the first interconnect barrel 102 through the first conductive trace 130 and the first section 118. The first device 140 may further be coupled to the circuit board 106 through the first surface contact pads 114.

In a further aspect, the printed circuit board assembly 100 may include a second device 142, e.g., a central processing unit (CPU), a graphic processing unit (GPU), a memory controller, a field programmable gate array (FPGA), a neural network accelerator, a communication device such as a radio frequency integrated circuit (RFIC), or a platform controller hub (chipset), coupled to the second interconnect barrel 104 through the subsequent first conductive trace 138 and the subsequent first section 124. The second device 142 may further be coupled to the circuit board 106 through the first surface contact pads 114, vertical interconnects 144 and the second surface contact pads 116.

In various aspects, the first and the subsequent first conductive traces 130, 138 may be spaced apart from the second conductive trace 132 by the first voltage reference plane as discussed with reference to FIG. 1B. In an aspect, the first conductive trace 130, the first and the second sections 118, 120, the second conductive trace 132, the subsequent first and the subsequent second sections 124, 126 and the subsequent first conductive trace 138 may form a transmission line that may facilitate an electrical signal transmission between the first and the second devices 140, 142.

In one aspect, FIG. 1C (left) depicts a routing configuration that may facilitate an electrical signal transmission for single-ended interface, e.g., a LPDDR memory interface at ≥6400MT/s. This routing configuration may be implemented by including only one conductive trace to carry the signal, i.e., only one first conductive trace 130 coupled to a first interconnect barrel 102, which may in turn be coupled to a second conductive trace 132.

In an alternative aspect, FIG. 1C (right) depicts a routing configuration that may facilitate an electrical signal transmission for differential pair interfaces, e.g., a universal serial bus Gen4 (USB4.0) Interface operating at ≥20 Gbps, a peripheral component interconnect express Gen5 (PC1e5) interface operating at 32 Gbps or a serial-de-serializer (Serdes) ethernet interface operating at ≥112 Gbps. This routing configuration may be implemented by including a pair of conductive traces to carry matching signals, i.e., a pair of respective first conductive trace 130 coupled to a respective first interconnect barrel 102, which may in turn be coupled to a respective second conductive trace 132.

One advantage of the present disclosure is an improved signal integrity performance in the printed circuit board assembly. This can be achieved primarily with the reduction or removal of open-ended PTH stub, therefore minimizing reflection noises. The simulated electrical data is presented in FIGS. 2A, 2B, 3A and 3B. It can be observed from FIG. 2A that the insertion loss may be significantly reduced, from worst-case −20 dB (i.e., conventional routing design with open-ended PTH stub) to −7 dB (i.e., present disclosure) around 15-20 GHz range. On time-domain TDR plot (FIG. 2B), the present impedance deviation may also be less with reduced peak and valley impedances. The improvement of these key electrical impairments may translate to better channel performance, as illustrated in FIGS. 3A and 3B. 15-20% of eye margin improvement can be seen in simulated 8500MT/s LPDDR5 and 10 Gbps USB channel. In the USB case, eye opening of the invention may be as good as the benchmark design i.e., without the impact of open-ended PTH stub.

FIGS. 4A through 4G show cross-sectional views directed to an exemplary simplified process flow for forming a printed circuit board assembly 400 according to an aspect that is generally similar to that shown in FIG. 1A of the present disclosure. The order of assembly process operation may be interchangeable.

Figure 4A:
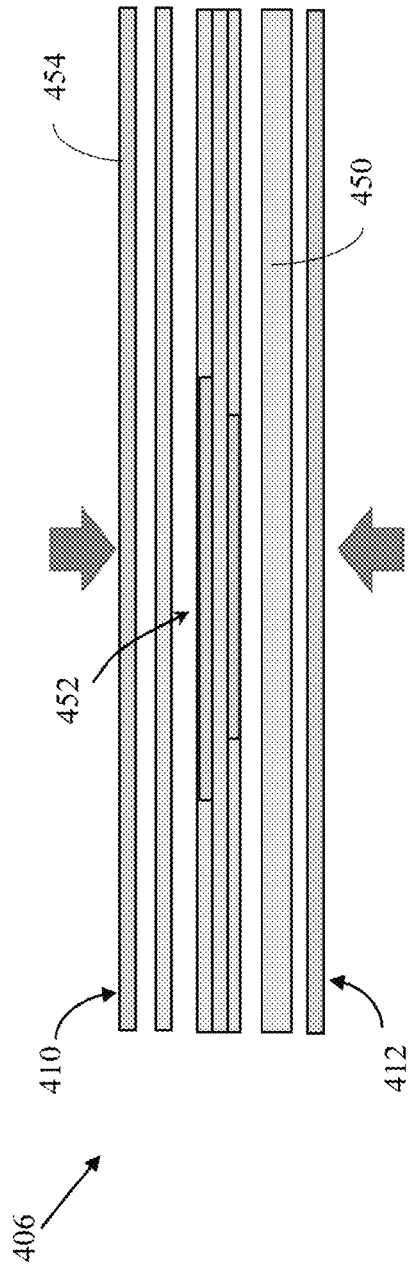
FIGS. 4A through 4G show cross-sectional views directed to an exemplary simplified process flow for forming a printed circuit board assembly according to an aspect that is generally similar to that shown in FIG. 1A of the present disclosure.

FIG. 4A shows formation of a circuit board 406 stack-up. The circuit board 406 may be formed of several alternating prepreg layer 450 and copper clad layer 452. The copper clad layer 452 may be formed through conventional techniques, for example, by lamination, photolithography imaging or chemical etching. The circuit board 406 may further include a respective copper layer 454 on the outermost top and bottom surfaces 410, 412. The respective layers may be laminated or hot-pressed together to form the circuit board 406.

Figure 4B:
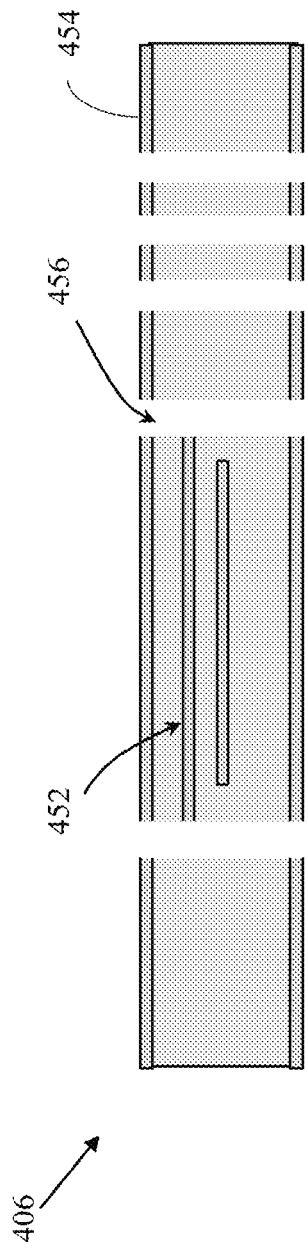

FIG. 4B shows formation of through hole openings 456 in the circuit board 406. The through hole openings 456 may be formed, for example, by mechanical or laser drilling.

Figure 4C:
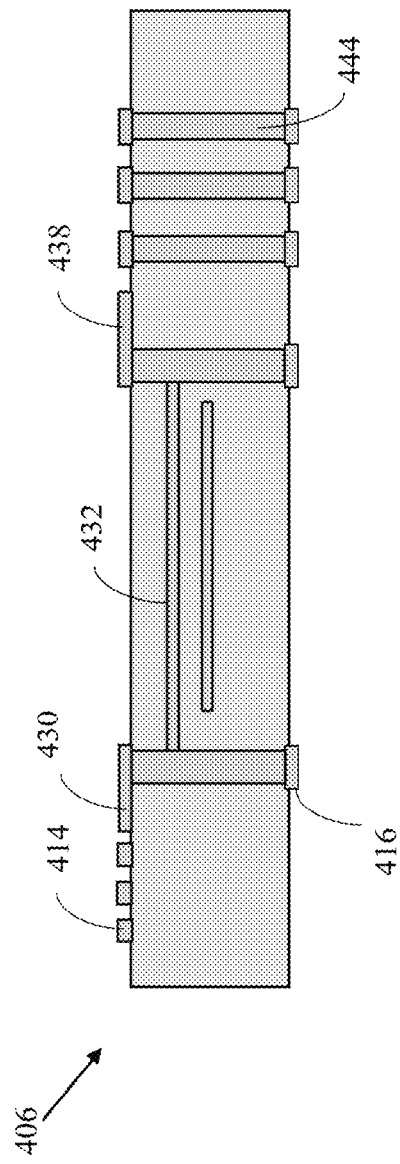

FIG. 4C shows formation of vertical interconnects 444, conductive traces 430, 438 and contact pads 414, 416. The interconnects 444 may be formed by an electroless or electrolytic plating in the through hole openings 456. Further, selected portions of the top and bottom copper layers 454 may be etched to form the contact pads 414, 416, a first conductive and a subsequent first conductive traces 430, 438. As shown in this figure, an inner copper clad layer 452 may form a second conductive trace 432 coupled to two interconnects 444.

Figure 4D:
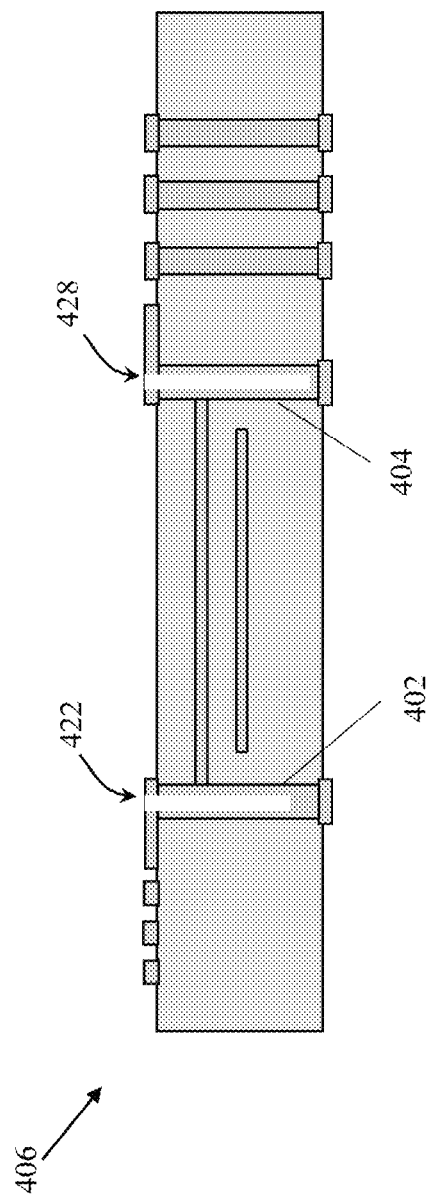

FIG. 4D shows formation of a first interconnect barrel 402 and a second interconnect barrel 404 by mechanical drilling or chemical etching. For example, a first gap 422 in the first interconnect barrel 402 may be formed by drilling or etching from the top until a first depth may be reached. A second gap 428 in the second interconnect barrel 404 may be formed by drilling or etching from the top until a second depth may be reached.

Figure 4E:
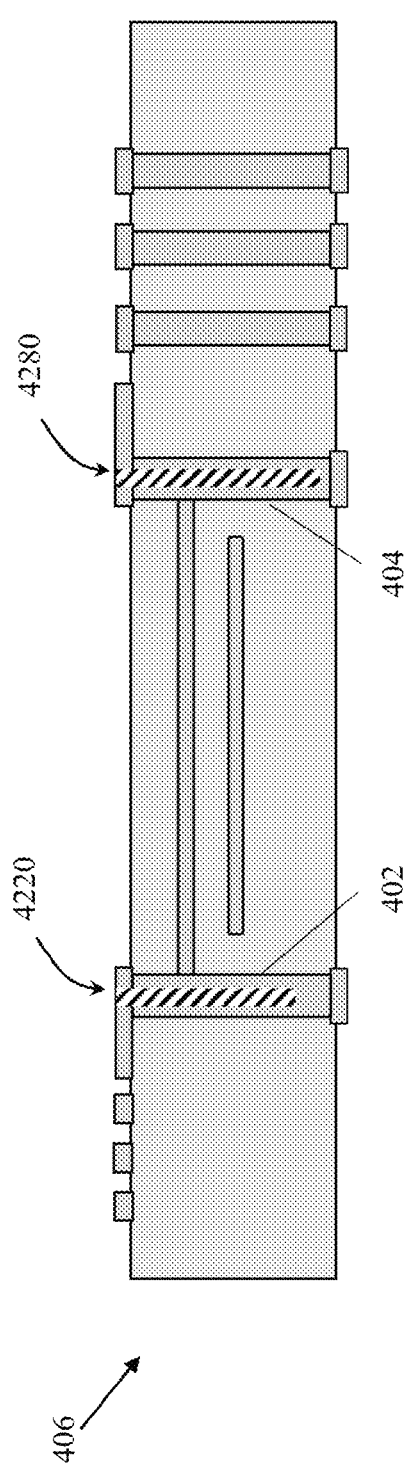

After forming the first and second gaps 422, 428 in the respective interconnect barrel 402, 404, a dielectric material 4220, 4280 may be deposited in the first and second gaps 422, 428 by printing, spin coating, dispensing or plugging, as shown in FIG. 4E.

Figure 4F:
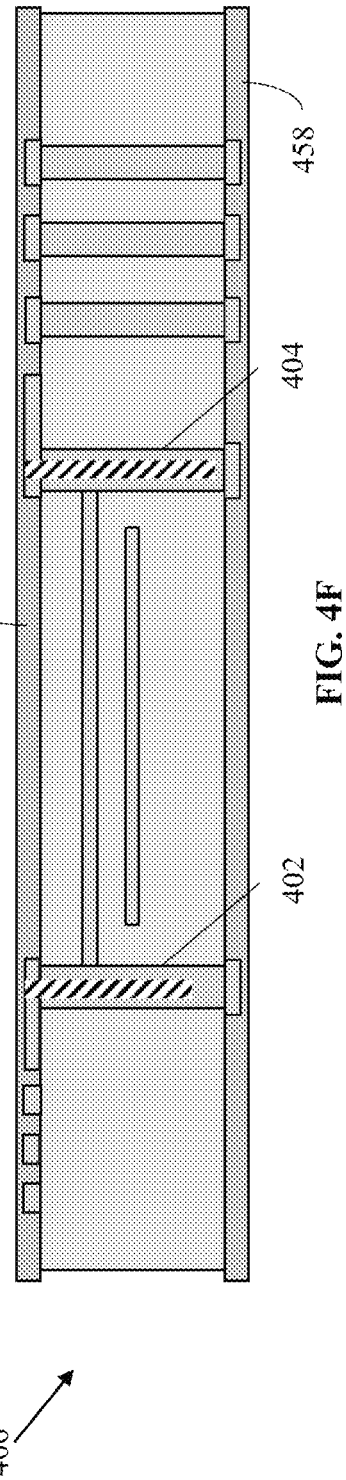

FIG. 4F shows formation of a solder resist layer 458 on the top and bottom surfaces 410, 412 of the circuit board 406. Conventional lamination, photolithography or etching process may be used here.

Figure 4G:
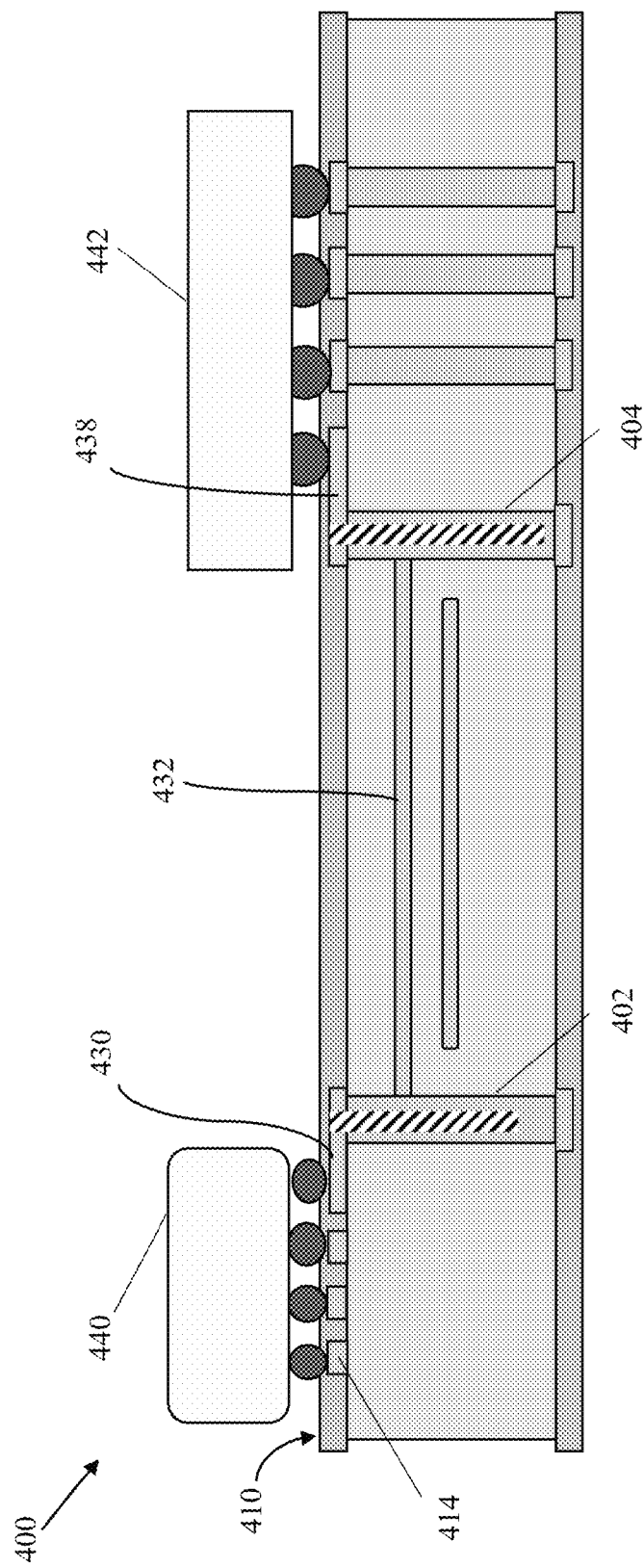

FIG. 4G shows attachment of various devices 440, 442 onto the circuit board 406 to form the printed circuit board assembly 400. For example, a first device 440 may be coupled to the first conductive trace 430 and contact pads 414 on the top surface 410. A second device 442 may be coupled to the subsequent first conductive trace 438 and contact pads 414 on the top surface 410. The various devices 440, 442 may be attached by surface mounting, solder reflow or thermal compression bonding processes.

Figure 5:
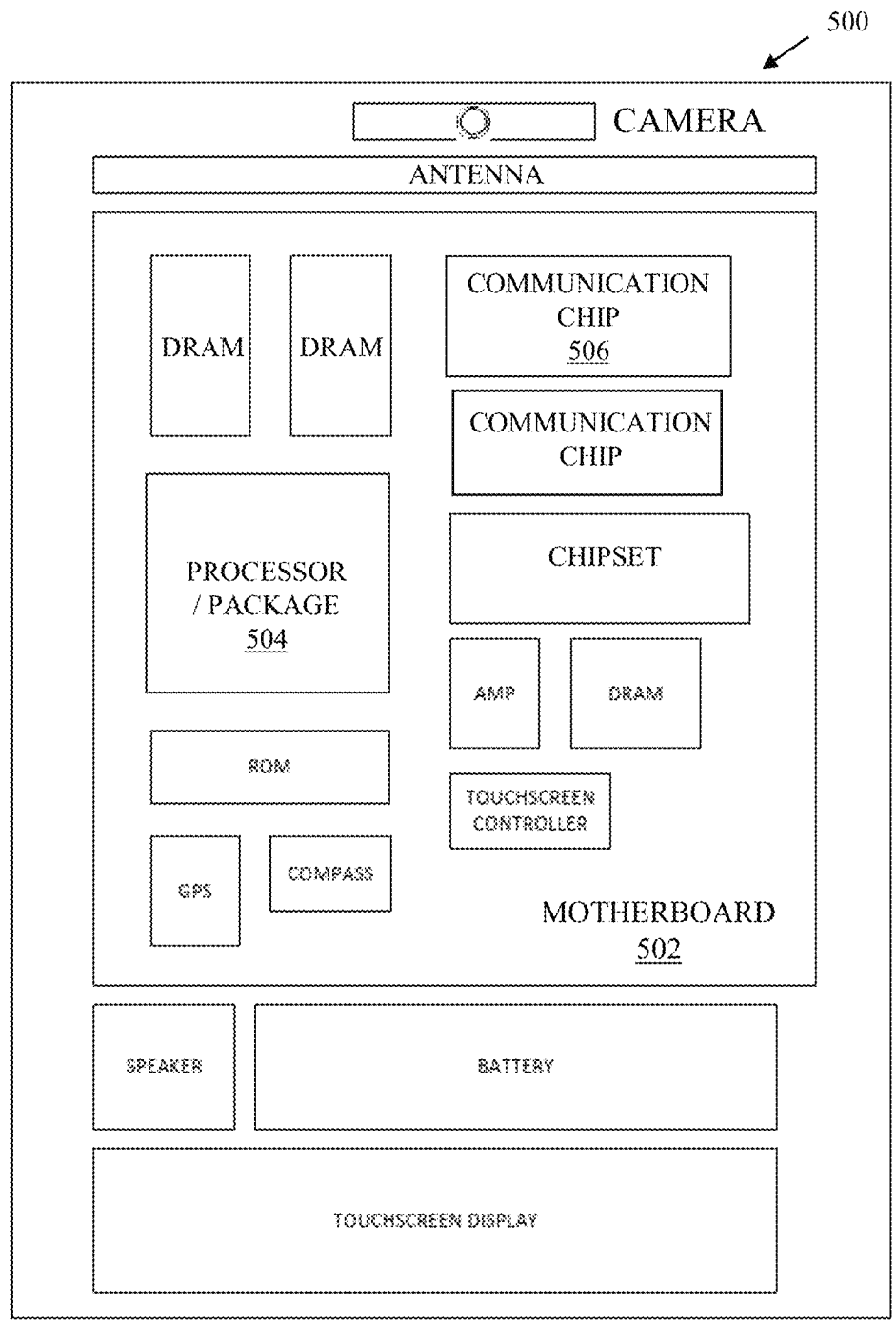
FIG. 5 shows an illustration of a computing device that includes a printed circuit board assembly according to a further aspect of the present disclosure.

Aspects of the present disclosure may be implemented into a system using any suitable hardware and/or software. FIG. 5 schematically illustrates a computing device 500 that may include a printed circuit board assembly as described herein, in accordance with some aspects. The computing device 500 may house a board such as a motherboard 502. The motherboard 502, which may be a printed circuit board assembly according to the present disclosure, may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

Figure 6:
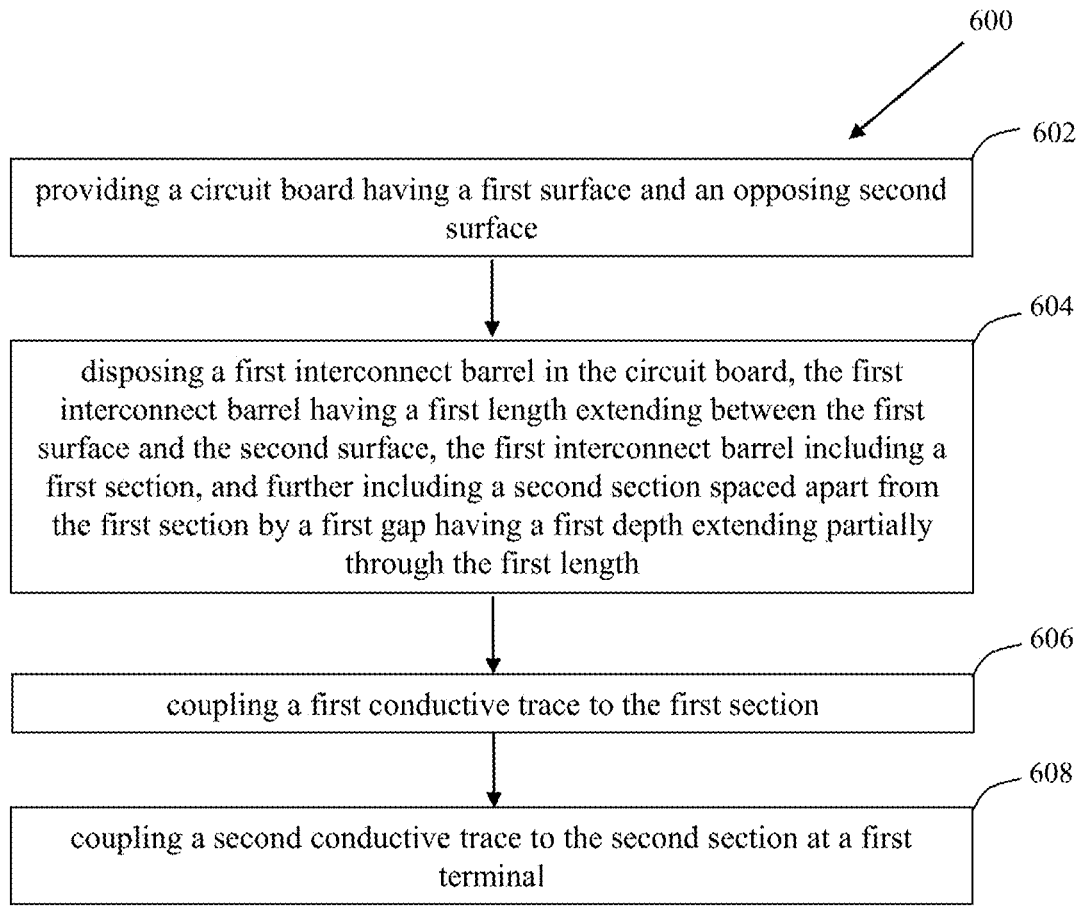
FIG. 6 shows a flow chart illustrating a method for forming a printed circuit board assembly according to an aspect of the present disclosure.

FIG. 6 shows a flow chart illustrating a method 600 of forming a printed circuit board assembly according to an aspect of the present disclosure.

At operation 602, the method 600 of forming the printed circuit board assembly may include providing a circuit board having a first surface and an opposing second surface.

At operation 604, the method 600 of forming the printed circuit board assembly may further include disposing a first interconnect barrel in the circuit board, the first interconnect barrel having a first length extending between the first surface and the second surface, the first interconnect barrel including a first section, and further including a second section spaced apart from the first section by a first gap having a first depth extending partially through the first length.

At operation 606, the method 600 of forming the printed circuit board assembly may further include coupling a first conductive trace to the first section.

At operation 608, the method 600 of forming the printed circuit board assembly may further include coupling a second conductive trace to the second section at a first terminal.

It will be understood that the above operations described above relating to FIG. 6 are not limited to this particular order. Any suitable, modified order of operations may be used.

EXAMPLES

Example 1 may include a printed circuit board assembly including a circuit board having a first surface and an opposing second surface; a first interconnect barrel disposed in the circuit board, the first interconnect barrel having a first length extending between the first surface and the second surface, the first interconnect barrel including a first section, and further including a second section spaced apart from the first section by a first gap having a first depth extending partially through the first length; a first conductive trace coupled to the first section; and a second conductive trace coupled to the second section at a first terminal.

Example 2 may include the printed circuit board assembly of example 1 and/or any other example disclosed herein, further including a second interconnect barrel disposed in the circuit board, the second interconnect barrel having a second length extending between the first surface and the second surface.

Example 3 may include the printed circuit board assembly of example 2 and/or any other example disclosed herein, wherein the second interconnect barrel may include a subsequent first section, and may further include a subsequent second section spaced apart from the subsequent first section by a second gap having a second depth extending partially through the second length.

Example 4 may include the printed circuit board assembly of example 3 and/or any other example disclosed herein, wherein the second conductive trace may be coupled to the subsequent second section at a second terminal.

Example 5 may include the printed circuit board assembly of example 3 and/or any other example disclosed herein, wherein the first depth or the second depth may range between 15% and 95% of the first length or the second length, respectively.

Example 6 may include the printed circuit board assembly of example 3 and/or any other example disclosed herein, wherein the first gap, the second gap, or both, may include a dielectric layer or air.

Example 7 may include the printed circuit board assembly of example 1 and/or any other example disclosed herein, wherein the first and second conductive traces may extend in parallel to the first surface and the second surface.

Example 8 may include the printed circuit board assembly of example 1 and/or any other example disclosed herein, wherein the first conductive trace may be disposed adjacent the first surface.

Example 9 may include the printed circuit board assembly of example 1 and/or any other example disclosed herein, further including a first voltage reference plane disposed between the first conductive trace and a first side of the second conductive trace.

Example 10 may include the printed circuit board assembly of example 1 and/or any other example disclosed herein, further including a second voltage reference plane disposed adjacent the second conductive trace on a second side opposite the first side.

Example 11 may include the printed circuit board assembly of example 1 and/or any other example disclosed herein, further including a first device coupled to the first interconnect barrel through the first conductive trace and the first section.

Example 12 may include the printed circuit board assembly of example 3 and/or any other example disclosed herein, further including a second device coupled to the second interconnect barrel through a subsequent first conductive trace and the subsequent first section, wherein the subsequent first conductive trace may be spaced apart from the second conductive trace by the first voltage reference plane.

Example 13 may include a computing device including a communication chip and a printed circuit board assembly coupled to the communication chip, the printed circuit board assembly may include a circuit board having a first surface and an opposing second surface; a first interconnect barrel disposed in the circuit board, the first interconnect barrel having a first length extending between the first surface and the second surface, the first interconnect barrel including a first section, and further including a second section spaced apart from the first section by a first gap having a first depth extending partially through the first length; a first conductive trace coupled to the first section; and a second conductive trace coupled to the second section at a first terminal.

Example 14 may include the computing device of any one of examples 1 to 13 disclosed herein, further including a second interconnect barrel disposed in the circuit board, the second interconnect barrel having a second length extending between the first surface and the second surface.

Example 15 may include the computing device of any one of examples 1 to 14 disclosed herein, wherein the second interconnect barrel may include a subsequent first section, and may further include a subsequent second section spaced apart from the subsequent first section by a second gap having a second depth extending partially through the second length.

Example 16 may include the computing device of any one of examples 1 to 15 disclosed herein, wherein the first depth or the second depth may range between 15% and 95% of the first length or the second depth, respectively.

Example 17 may include a method including providing a circuit board having a first surface and an opposing second surface; disposing a first interconnect barrel in the circuit board, the first interconnect barrel having a first length extending between the first surface and the second surface, the first interconnect barrel including a first section, and further including a second section spaced apart from the first section by a first gap having a first depth extending partially through the first length; coupling a first conductive trace to the first section; and coupling a second conductive trace to the second section at a first terminal.

Example 18 may include the method of example 17 and/or any other example disclosed herein, further including disposing a second interconnect barrel in the circuit board, the second interconnect barrel having a second length extending between the first surface and the second surface.

Example 19 may include the method of example 18 and/or any other example disclosed herein, wherein the second interconnect barrel may include a subsequent first section, and may further include a subsequent second section spaced apart from the subsequent first section by a second gap having a second depth extending partially through the second length.

Example 20 may include the method of example 19 and/or any other example disclosed herein, wherein the first depth or the second depth may range between 15% and 95% of the first length or the second depth, respectively.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A printed circuit board assembly comprising:
   a circuit board having a first surface and an opposing second surface;
   a first interconnect barrel disposed in the circuit board, the first interconnect barrel having a first length extending between the first surface and the second surface, the first interconnect barrel comprising a first section, and further comprising a second section spaced apart from the first section by a first gap having a first depth extending partially through the first length;
   a second interconnect barrel disposed in the circuit board, the second interconnect barrel having a second length extending between the first surface and the second surface, the second interconnect barrel comprising a subsequent first section, and further comprising a subsequent second section spaced apart from the subsequent first section by a second gap having a second depth extending partially through the second length;
   a first conductive trace coupled to the first section, wherein the first conductive trace is disposed adjacent the first surface; and
   a second conductive trace coupled to the second section at a first terminal and coupled to the subsequent second section at a second terminal, wherein the first terminal and the second terminal are disposed between the first conductive trace and the opposing second surface.

2. The printed circuit board assembly of claim 1, wherein the first depth or the second depth ranges between 15% and 95% of the first length or the second length, respectively.

3. The printed circuit board assembly of claim 1, wherein the first gap, the second gap, or both, comprise a dielectric layer or air.

4. The printed circuit board assembly of claim 1, wherein the first and second conductive traces extend in parallel to the first surface and the second surface.

5. The printed circuit board assembly of claim 1, further comprising a first voltage reference plane disposed between the first conductive trace and a first side of the second conductive trace.

6. The printed circuit board assembly of claim 1, further comprising a second voltage reference plane disposed adjacent the second conductive trace on a second side opposite the first side.

7. The printed circuit board assembly of claim 1, further comprising a first device coupled to the first interconnect barrel through the first conductive trace and the first section.

8. The printed circuit board assembly of claim 1, further comprising a second device coupled to the second interconnect barrel through a subsequent first conductive trace and the subsequent first section, wherein the subsequent first conductive trace is spaced apart from the second conductive trace by the first voltage reference plane.

9. A computing device comprising:
a communication chip; and
a printed circuit board assembly coupled to the communication chip, the printed circuit board assembly comprising:
  a circuit board having a first surface and an opposing second surface;
  a first interconnect barrel disposed in the circuit board, the first interconnect barrel having a first length extending between the first surface and the second surface, the first interconnect barrel comprising a first section, and further comprising a second section spaced apart from the first section by a first gap having a first depth extending partially through the first length;
  a second interconnect barrel disposed in the circuit board, the second interconnect barrel having a second length extending between the first surface and the second surface, the second interconnect barrel comprising a subsequent first section, and further comprising a subsequent second section spaced apart from the subsequent first section by a second gap having a second depth extending partially through the second length;
  a first conductive trace coupled to the first section, wherein the first conductive trace is disposed adjacent the first surface; and
  a second conductive trace coupled to the second section at a first terminal and coupled to the subsequent second section at a second terminal, wherein the first terminal and the second terminal are disposed between the first conductive trace and the opposing second surface.

10. The computing device of claim 9, wherein the first depth or the second depth ranges between 15% and 95% of the first length or the second depth, respectively.

11. A method comprising:
providing a circuit board having a first surface and an opposing second surface;
disposing a first interconnect barrel in the circuit board, the first interconnect barrel having a first length extending between the first surface and the second surface, the first interconnect barrel comprising a first section, and further comprising a second section spaced apart from the first section by a first gap having a first depth extending partially through the first length;
disposing a second interconnect barrel in the circuit board, the second interconnect barrel having a second length extending between the first surface and the second surface, the second interconnect barrel comprising a subsequent first section, and further comprising a subsequent second section spaced apart from the subsequent first section by a second gap having a second depth extending partially through the second length;
coupling a first conductive trace to the first section, wherein the first conductive trace is disposed adjacent the first surface; and
coupling a second conductive trace to the second section at a first terminal and to the subsequent second section at a second terminal, wherein the first terminal and the second terminal are disposed between the first conductive trace and the opposing second surface.

12. The method of claim 11, wherein the first depth or the second depth ranges between 15% and 95% of the first length or the second depth, respectively.

* * * * *